US007123482B2

(12) United States Patent
Barsun et al.

(10) Patent No.: US 7,123,482 B2
(45) Date of Patent: Oct. 17, 2006

(54) LEVERS FOR SUPPORT OF HEATSINK COMPONENT

(75) Inventors: Stephan Karl Barsun, Sacramento, CA (US); Michael Wortman, Sacramento, CA (US); Bryan D. Bolich, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 300 days.

(21) Appl. No.: 10/737,377

(22) Filed: Dec. 16, 2003

(65) Prior Publication Data

US 2005/0128708 A1 Jun. 16, 2005

(51) Int. Cl.
*H05K 7/20* (2006.01)

(52) U.S. Cl. ............... 361/704; 361/703; 361/705; 361/709; 361/719; 257/718; 257/719; 174/16.3; 165/80.3; 24/458

(58) Field of Classification Search ............... 361/687, 361/697, 702–710, 717–719; 439/342, 485; 174/16.1, 16.3; 165/80.2, 80.3, 185, 121–126; 257/706–727; 248/505, 510; 24/453, 457, 24/458; 411/516, 522, 523, 520

See application file for complete search history.

(56) References Cited

U.S. PATENT DOCUMENTS

| 5,448,449 A | 9/1995 | Bright et al. | |
|---|---|---|---|
| 5,493,475 A * | 2/1996 | Lin ............................ | 361/710 |
| 5,771,960 A | 6/1998 | Lin | |
| 5,791,403 A * | 8/1998 | Chiou ........................ | 165/80.3 |
| 5,933,326 A | 8/1999 | Lee et al. | |
| 6,082,440 A * | 7/2000 | Clemens et al. ........... | 165/80.3 |
| 6,318,452 B1 * | 11/2001 | Lee ............................ | 165/80.3 |
| 6,418,022 B1 * | 7/2002 | Chen .......................... | 361/704 |
| 6,452,801 B1 * | 9/2002 | Chen .......................... | 361/704 |
| 6,477,049 B1 * | 11/2002 | Lin ............................. | 361/704 |
| 6,532,153 B1 * | 3/2003 | Chiu .......................... | 361/703 |
| 6,574,109 B1 * | 6/2003 | McHugh et al. ............ | 361/719 |
| 6,618,253 B1 | 9/2003 | Szu et al. | |
| 6,735,085 B1 * | 5/2004 | McHugh et al. ............ | 361/719 |
| 6,906,923 B1 * | 6/2005 | Lofland et al. ............. | 361/704 |
| 6,934,153 B1 * | 8/2005 | Lee et al. ................... | 361/697 |
| 2003/0228789 A1 | 12/2003 | Chang et al. | |

OTHER PUBLICATIONS

"Levers"; www.phys.virginia.edu/Education/outreach/8thgradesol/Levers.htm;Dept. of Physics, UVA, 382 McCormick Rd., P.O. Box 400714, Charlottesville, VA 22904-4714; Aug. 26, 2003, pp. 1-6, USA.

"Fulcrum"; Dictionary.Com; http://dictionary.reference.com/search?q=_fulcrum; Lexico, LLC; Lexico, LLC, 13428 Maxella Avenue #236, Marina del Rey, CA 90292; 6 pgs.; Mar. 13, 2002; Oct. 1, 2003, pp. 1-3, USA.

"First Class Lever"; http://www.science.sjsu.edu/CSP-PISE/firstclasslever.html; San Jose State University, College Of Science, One Washington Square, San Jose CA 95192-0099; Aug. 27, 2003, p. 1, USA.

(Continued)

*Primary Examiner*—Michael Datskovskiy (57) ABSTRACT

An apparatus in one example comprises a plurality of levers that convert a lesser input force to a greater output force for support of a heatsink component coupled with an electronic component.

37 Claims, 6 Drawing Sheets

OTHER PUBLICATIONS

"Second Class Lever"; http://www.science.sjsu.edu/CSP-PISE/secondclasslever.html; San Jose State University, College Of Science, One Washington Square, San Jose CA 95192-0099; Aug. 27, 2003, p. 1, USA.

"Third Class Lever"; http://www.science.sjsu.edu/CSP-PISE/thirdclasslever.html; San Jose State University, College Of Science, One Washington Square, San Jose CA 95192-0099; Aug. 27, 2003, p. 1, USA.

"Compound Lever"; http://dictionary.reference.com/search?q=_compound%20lever; Lexico, LLC; Lexico, LLC, 13428 Maxella Avenue #236, Marina del Rey, CA 90292; Aug. 27, 2003, pp. 1-3, USA.

"Mechanical Advantage", http://dictionary.reference.com/search?q=_mechanical%20advantage; Lexico, LLC; Lexico, LLC, 13428 Maxella Avenue #236, Marina del Rey, CA 90292; Oct. 9, 2003, pp. 1-2, USA.

"Heat Sink"; http://us.enlightcorp.com/products/heat_sink/detel.php?kind=_heatsink&serid=_61; Enlight Corporation USA, 12029 Telegraph Road, Santa Fe Springs, CA, 90670; Jul. 22, 2003, pp. 1-2, USA.

"Mono Leaf Spring"; TotalPerformance, Inc., 400 South Orchard St., Wallingford, CT 06492; http://www.tperformance.com/street_rod_store/front_suspension/mono_leaf_spring/; Sep. 24, 2003, pp. 1-4, USA.

* cited by examiner

LEVERS FOR SUPPORT OF HEATSINK COMPONENT

BACKGROUND

Electrical components in one design of an electronic device generate heat during operation. Heatsinks of the electronic device serve to draw the heat away from the electronic components for dissipation into the environment. Coupling devices connect the heatsink to the electronic components to allow for movement and vibration of the electronic device without separation of the heatsink from the electronic components. For example, the coupling devices comprise screws, wireform clips, and/or simple springs.

SUMMARY

The invention in one implementation encompasses an apparatus. The apparatus comprises a plurality of levers that convert a lesser input force to a greater output force for support of a heatsink component coupled with an electronic component.

Another implementation of the invention encompasses a method. A plurality of levers are arranged in a cooperative relationship that promotes an increase in an output force that supports a heatsink component coupled with an electronic component.

A further implementation of the invention encompasses an apparatus. The apparatus comprises means for converting a lesser input force to an intermediate force, where the intermediate force is greater than the lesser input force. The apparatus comprises means for converting the intermediate force to a greater output force on a heatsink component coupled with an electronic component, where the greater output force is greater than the intermediate force. The apparatus comprises means for coupling the means for converting the lesser input force to the intermediate force with one or more of the electronic component and the means for converting the intermediate force to the greater output force on the heatsink component coupled with the electronic component. The apparatus comprises means for coupling the means for converting the intermediate force to the greater output force on the heatsink coupled with the electronic component with the electronic component.

Yet another implementation of the invention encompasses a method. A lesser input force is converted to an intermediate force through employment of a first lever, where the intermediate force is greater than the lesser input force. The intermediate force is converted to an output force on a heatsink component through employment of a second lever, where the output force is greater than the intermediate force.

DESCRIPTION OF THE DRAWINGS

Features of exemplary implementations of the invention will become apparent from the description, the claims, and the accompanying drawings in which:

DETAILED DESCRIPTION

Referring to the BACKGROUND section above, the coupling devices for connecting the heatsink to the electronic component are often unable to provide sufficient force to secure a heatsink of relatively large size and/or mass. Also, the coupling devices often require that extra tools be employed by a user for installation of the heatsink, or for removal of the heatsink to gain access to the electronic components and perform maintenance of the electronic device.

Figure 1:
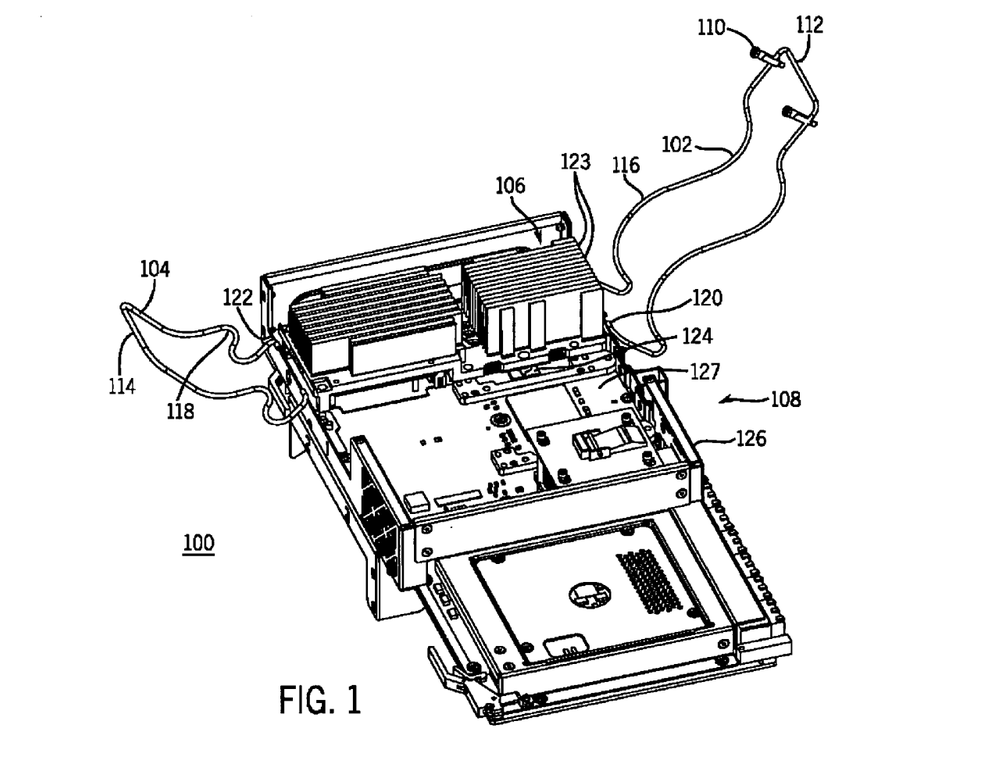
FIG. 1 is a perspective representation of one exemplary implementation of an apparatus that comprises a plurality of levers, one or more heatsink components, and one or more electronic components, and illustrates one example of non-engagement of a first lever with an electronic component.

Turning to FIG. 1, an apparatus 100 in one example comprises a plurality of components such as hardware components. A number of such components can be combined or divided in the apparatus 100. The apparatus 100 in one example comprises any (e.g., horizontal, oblique, or vertical) orientation, with the description and figures herein illustrating one exemplary orientation of the apparatus 100, for explanatory purposes.

The apparatus 100 in one example comprises a plurality of levers, for example, levers 102 and 104, one or more heatsink components 106, and one or more electronic components 108. In one example, the apparatus 100 comprises one or more portions of an electronic device. The levers 102 and 104 in one example serve to support the heatsink component 106. In a further example, the levers 102 and 104 serve to couple the heatsink component 106 with the electronic component 108. For example, the levers 102 and 104 support and/or secure the heatsink component 106 against one or more portions of the electronic component 108.

In one example, the levers 102 and/or 104 comprise one or more wireform levers and/or one or more leaf springs. The levers 102 and 104 in one example comprise respective wireform levers. For example, the levers 102 and 104 are formed from bent wire. In another example, the levers 102 and 104 comprise one wireform lever and one leaf spring. In yet another example, the levers 102 and 104 comprise respective leaf springs.

Where the lever 102 in one example comprises a leaf spring, compression of the leaf spring by a user (not shown) causes the leaf spring to bend from an original or unloaded state of the leaf spring. The lever 102 resists the compression with a counteracting force that is (e.g., substantially) proportional to the amount of compression. The lever 102 in one example applies the counteracting force to the heatsink component 106 within a predetermined tolerance range that is selected to maintain integrity of a thermal interface 502 (FIGS. 5–6) between the heatsink component 106 and the electronic component 108. In one example, the predetermined tolerance range of the load force comprises approximately two hundred sixty-seven newtons (sixty pounds) ±10%, or approximately between two hundred forty newtons (fifty-four pounds) and two hundred ninety-three newtons (sixty-six pounds).

The levers 102 and/or 104 in one example comprise one or more fastener components 110. For example, the fastener component 110 comprises a latch and/or a lock. The fastener component 110 in one example secures the levers 102 and/or 104 from movement relative to the electronic component 108. In one example, the fastener component 110 engages the lever 102 with the electronic component 108. In a further example, the fastener component 110 locks the lever 102 in place against the heatsink component 106 and/or the electronic component 108.

The lever 102 in one example comprises one or more effort points 112, one or more load points 116, and a fulcrum 120. The lever 104 in one example comprises one or more effort points 114, one or more load points 118, and a fulcrum 122. An effort force applied by the user to the lever 102 at the effort point 112 in one example causes the lever 102 to pivot about the fulcrum 120 and apply a load force at the load point 116. For example, the user applies the effort force onto the lever 102 by pushing with the user's hand on the effort point 112 to exert a torque on the lever 102 that creates the load force at the load point 116.

The fulcrums 120 and/or 122 in one example are supported with one or more portions of the electronic component 108. For example, the electronic component 108 comprises a pin (not shown) that serves as an axis for rotational support of the lever 102 about the fulcrum 120. In a further example, the levers 102 and 104 comprise second class levers. For example, where the load force applied to the heatsink component 106 is greater than the effort force applied to the effort point 112 and the effort force and load force are on a same side of the fulcrum 120, the lever 102 as the second class lever converts the effort force into the load force.

Figure 5:
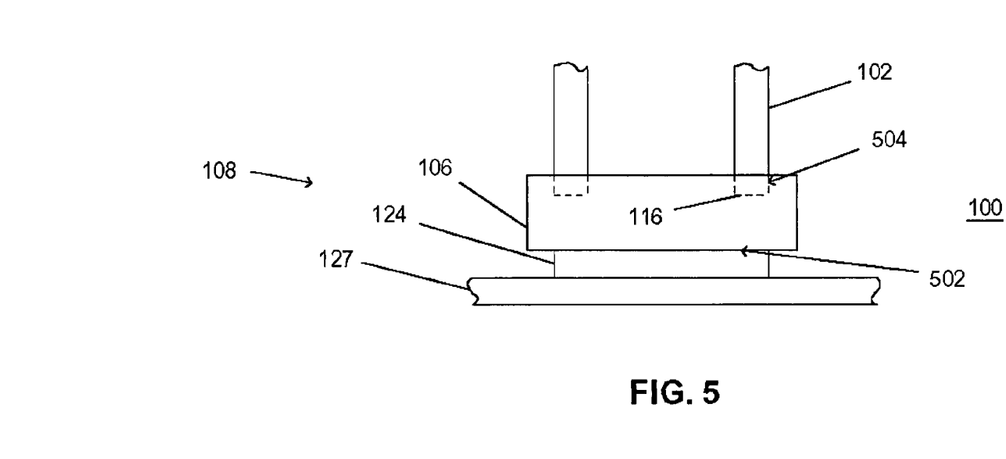
FIG. 5 is a cutaway, partial, sectional, enlarged, side representation of the heatsink component and the electronic component of the apparatus of FIG. 1 and illustrates the heatsink with a recess that receives the first lever and a thermal interface between the heatsink component and the electronic component.
Figure 6:
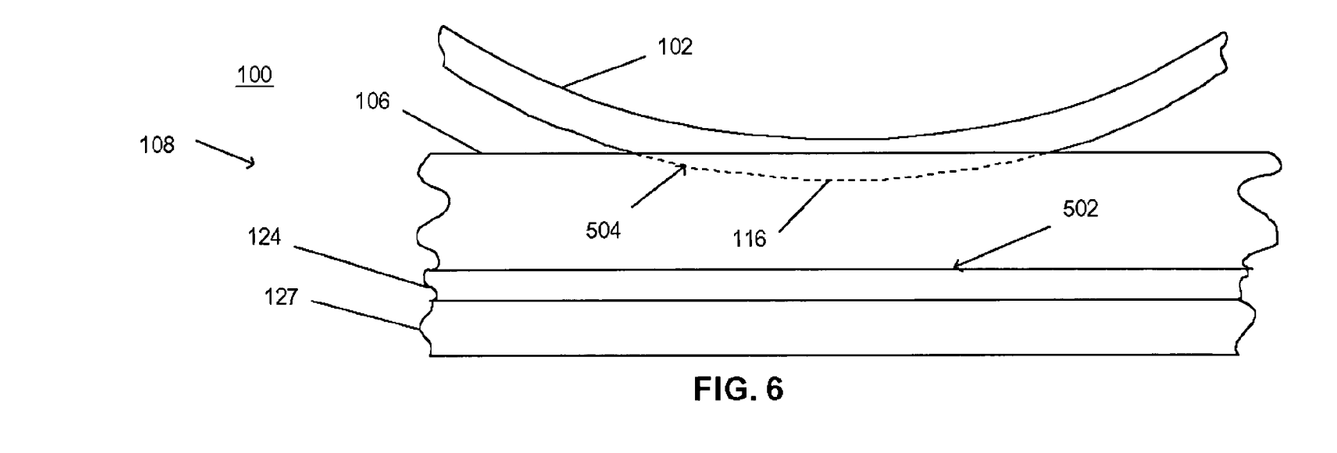
FIG. 6 is a cutaway, partial, sectional, enlarged, front representation of the heatsink component and the electronic component of the apparatus of FIG. 5.

The heatsink component 106 in one example comprises a material that promotes an increase in efficiency of heat conduction and/or dissipation. For example, the heatsink component 106 comprises one or more of graphite, copper, and aluminum. The heatsink component 106 in one example comprises one or more fins 123 and one or more recesses 504 (FIGS. 5–6). The fins 123 in one example serve to expose heat conducted therethrough to ambient air for cooling.

In one example, the heatsink component 106 serves to dissipate heat generated by the electronic component 108. For example, the heatsink component 106 cools the electronic component 108. The electronic component 108 and the heatsink component 106 transfer heat through the thermal interface 502 between the electronic component 108 and the heatsink component 106 to cool the electronic component 108. The heatsink component 106 employs convection to dissipate the heat by conducting the heat through the fins 123 that are exposed to a fluid such as air moving across the fins 123, as will be understood by those skilled in the art.

The electronic component 108 in one example comprises an integrated circuit ("IC") chip 124, a frame 126, and a circuit board 127. The integrated circuit chip 124 in one example is electrically coupled with the circuit board 127. In a further example, the integrated circuit chip 124 is mounted on the circuit board 127. In a still further example, the circuit board 127 is mounted on the frame 126. The levers 102 and 104 connect the heatsink component 106 with the electronic component 108 to promote an increase in efficiency of cooling of the integrated circuit chip 124 and/or the circuit board 127. For example, the levers 102 and 104 support the heatsink component 106 during vibration and/or movement of the electronic device that comprises the apparatus 100, to maintain integrity of the thermal interface 502 between the heatsink component 106 and the integrated circuit chip 124.

Figure 7:
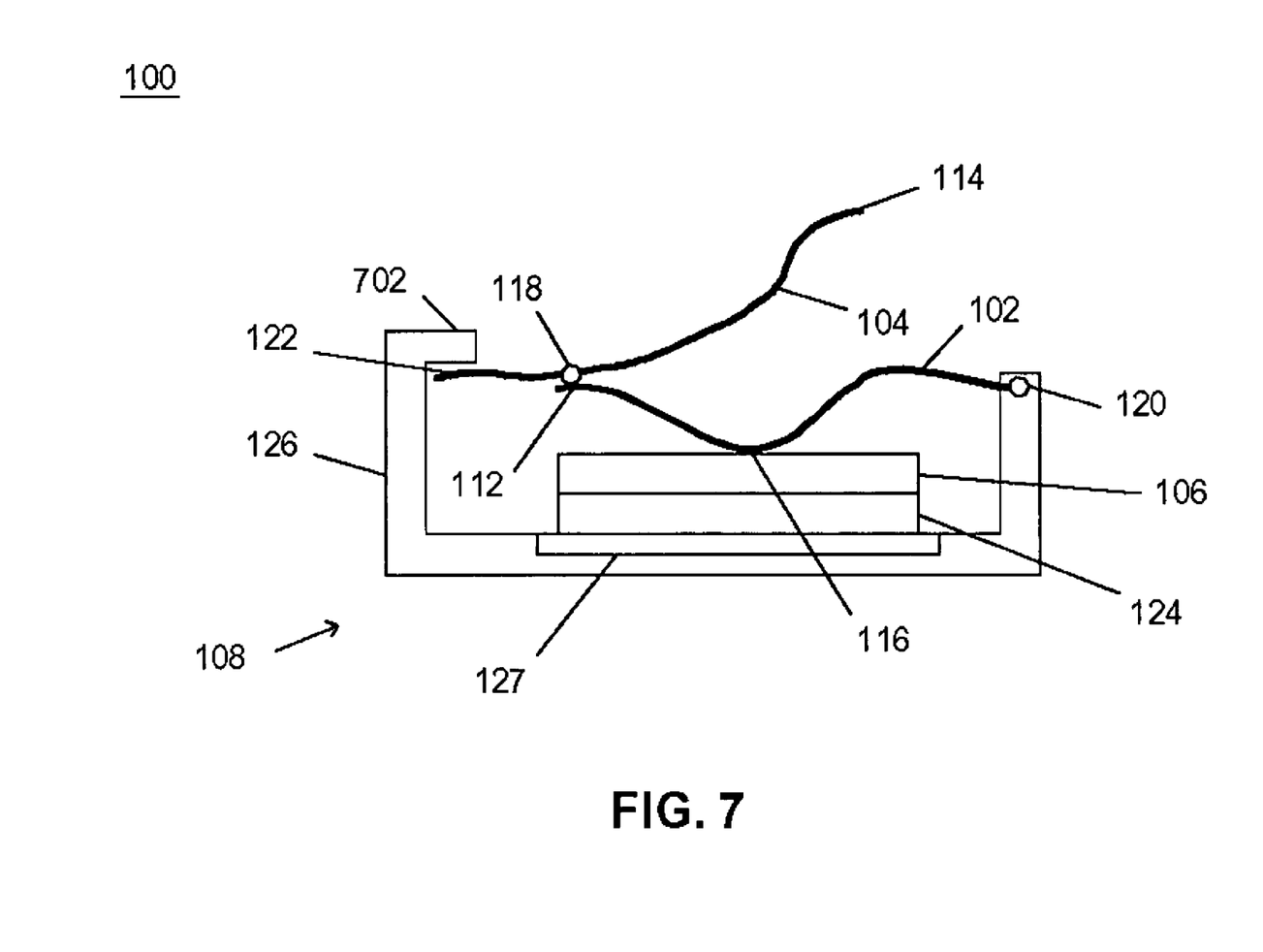
FIG. 7 is a partial, sectional, enlarged, front representation of another exemplary implementation of the apparatus of FIG. 1 and illustrates the electronic component with an abutment portion that limits a range of movement of a fulcrum of a second lever and the first lever coupled with the second lever.

The frame 126 in one example supports the fulcrums 120 and/or 122 and the circuit board 127. In one example, the frame 126 comprises an abutment portion 702 (FIG. 7). The abutment portion 702 in one example comprises a catch and/or a stop. For example, the abutment portion 702 serves to secure the fulcrums 120 and/or 122 from movement relative to the frame 126.

In one example and at a first point in time, referring to FIG. 1, the lever 102 is not engaged with the heatsink component 106. The lever 104 is not engaged with the lever 102. The heatsink component 106 is not secured to the electronic component 108 by the levers 102 and 104. For example, a shock and/or vibration of the electronic component 108 may dislocate the heatsink component 106.

Figure 2:
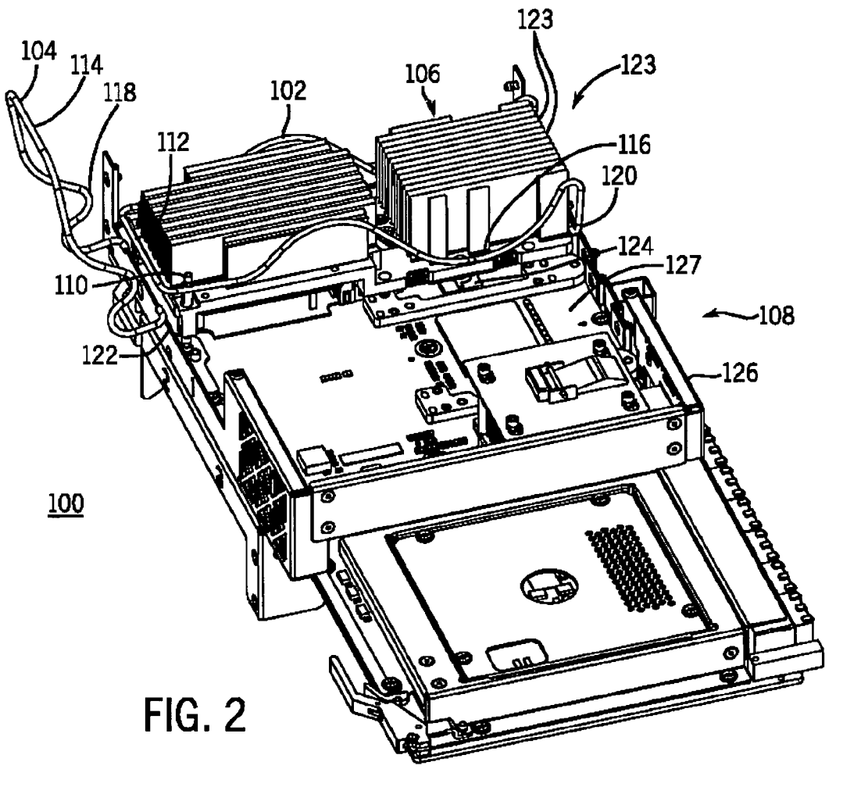
FIG. 2 is similar to FIG. 1 and illustrates one example of complete engagement of the first lever with the electronic component.

In a further example and at a second point in time, turning to FIG. 2, the lever 102 is engaged with the heatsink component 106. The lever 104 is not engaged with the lever 102. The lever 102 converts a force applied to the effort point 112 into a force on the heatsink component 106 that serves to support the heatsink component 106 against the electronic component 108.

Figure 3:
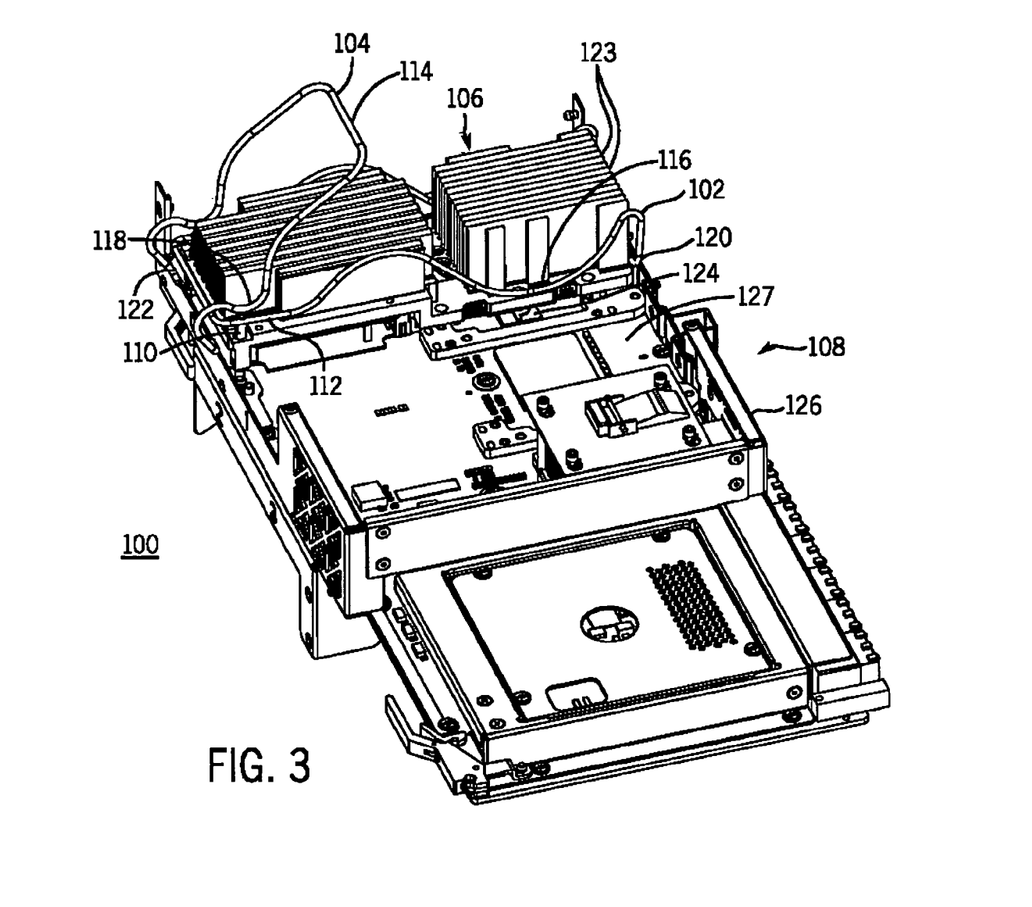
FIG. 3 is similar to FIG. 2 and illustrates one example of partial engagement of a second lever with the first lever.

In a still further example and at a third point in time, turning to FIG. 3, the lever 102 is engaged with the heatsink component 106. The lever 104 is partially engaged with the lever 102. The lever 104 converts a force applied to the effort point 114 into a force on the effort point 112. The lever 102 converts the force on the effort point 112 into the force on the heatsink component 106 that serves to support the heatsink component 106 against the electronic component 108.

Figure 4:
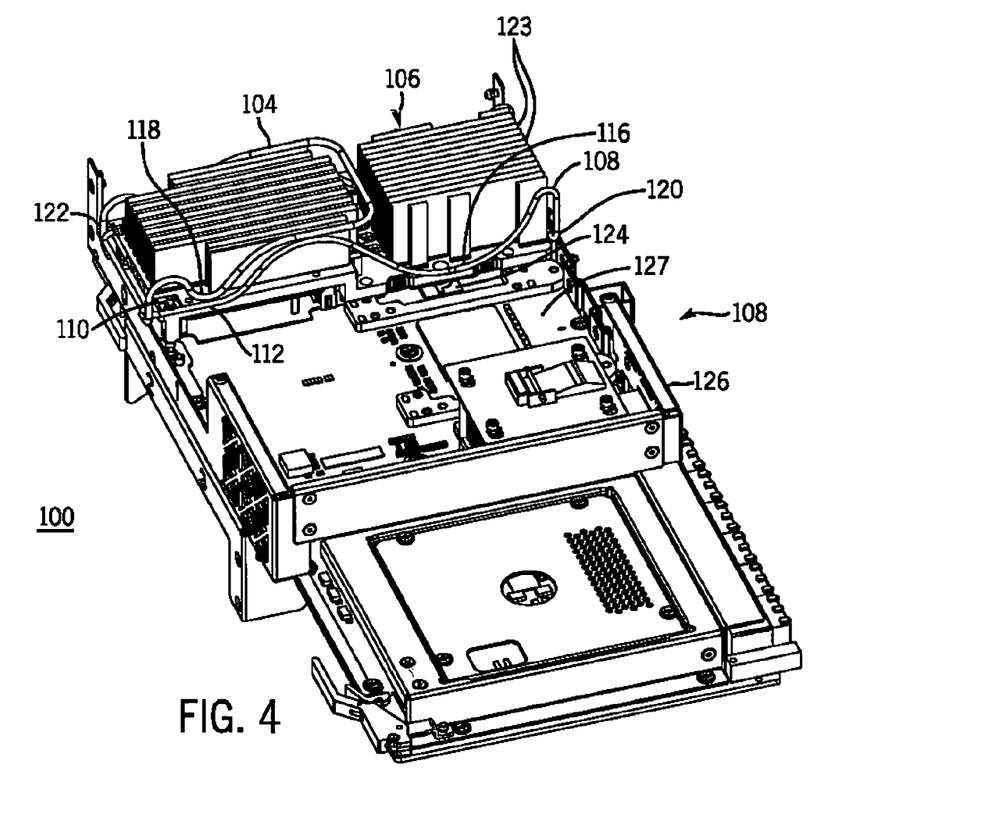
FIG. 4 is similar to FIG. 3 and illustrates one example of complete engagement of the second lever with the first lever.

In a further example and at a fourth point in time, turning to FIG. 4, the lever 102 is engaged with the heatsink component 106. The lever 104 is engaged with the lever 102. The lever 104 coverts the force applied to the effort point 114 into the force on the effort point 112. The lever 102 converts the force on the effort point 112 into the force on the heatsink component 106 that serves to support the heatsink component 106 against the electronic component 108.

Turning to FIGS. 5–6, the levers 102 and 104 in one example maintain the thermal interface 502 between the heatsink component 106 and the electronic component 108. When the electronic component 108 and the heatsink component 106 are sufficiently engaged, the thermal interface 502 serves to cool the electronic component 108 by conducting heat from the electronic component 108 and to the heatsink component 106. The levers 102 and/or 104 store spring energy for maintaining the thermal interface 502 between the heatsink component 106 and the electronic component 108. For example, the levers 102 and 104 promote retention of the heatsink component 106 against the electronic component 108 to secure the thermal interface 502 during shock and/or vibration of the electronic component 108.

The recesses 504 of the heatsink component 106 in one example serve to connect the levers 102 and/or 104 with the heatsink component 106. In one example, the recesses 504 receive and hold a number of the load points 116 of the lever 102. In a further example, the load point 116 of the lever 102 rests against a sidewall of the recess 504 to promote an increase in stability of the lever 102 and/or the heatsink component 106.

Turning to FIG. 7, in another implementation of the apparatus 100, the load point 118 of the lever 104 is coupled with the effort point 112 of the lever 102. The load point 118 is coupled with the effort point 112 such that an effort force applied by the user on the effort point 114 rotates the lever 102 about the load point 118. Next, the fulcrum 122 of the lever 102 engages the abutment portion 702 to stabilize the fulcrum 122. Subsequently, the lever 102 rotates about the fulcrum 122 to convert the effort force on the effort point 114 to a force on the effort point 112.

An illustrative description of exemplary operation of the apparatus 100 is presented, for explanatory purposes. At the first point in time, referring to FIG. 1, the lever 102 is not engaged with the heatsink component 106. The user wishes to secure the heatsink component 106 to the electronic component 108. At the second point in time, referring to FIG. 2, the user applies a lesser input force on the effort point 112. The effort point 112 receives the lesser input force such that the lever 102 rotates about the fulcrum 120 and the load point 116 engages the heatsink component 106.

The lesser input force compresses the lever 102 such that the lever 102 stores energy for applying a greater output force to the heatsink component 106. The lever 102 converts the lesser input force on the effort point 112 to the greater output force through the load point 116 on the heatsink component 106. The lever 102 employs the greater output force for support of the heatsink component 106 against one or more portions of the electronic component 108. The lever 102 converts the lesser input force to the greater output force such that the greater output force is greater than the lesser input force, as will be appreciated by those skilled in the art. For example, a ratio of the greater output force to the lesser input force is equal to four.

At the third point in time, referring to FIG. 3, the user applies the lesser input force to the effort point 114. The effort point 114 receives the lesser input force such that the lever 104 rotates about the fulcrum 122 and the load point 118 engages the effort point 112 to become completely engaged at the fourth point in time (FIG. 4). The lever 104 converts the lesser input force on the effort point 114 to an intermediate force through the load point 118 on the effort point 112. The lever 102 converts the intermediate force to the greater output force such that the intermediate force is greater than the lesser input force, as will be appreciated by those skilled in the art. For example, a ratio of the intermediate force to the lesser input force is equal to three.

The user applies the lesser input force to the lever 102, which converts the lesser input force to the intermediate force on the lever 104. The lever 104 converts the intermediate force to the greater output force on the heatsink component 106. For example, the lever 102 and the lever 104 cooperate to form a compound lever where the lever 104 acts on the lever 102. The exemplary description herein is easily extendible to an implementation of the apparatus 100 that employs additional levers 104. Where the intermediate force is three times the lesser input force and the greater output force is four times the intermediate force, the greater output force is equal to twelve times the lesser input force. For example, the user can apply five pounds of force to the lever 102 and achieve sixty pounds of force on the heatsink component 106, as will be appreciated by those skilled in the art.

In one example, the lever 102 is bent approximately four millimeters from the original state when the heatsink component 106 is in a nominal position with respect to the electronic component 108. The amount of bending of the lever 102 is affected by the nominal position of the heatsink component 106 with respect to the electronic component 108, for example, deviations in manufacturing cause a deviation from the nominal position of approximately ±0.4 millimeters. Where the leaf spring of the lever 102 comprises a linear spring rate, the load force will vary by approximately ±10%, as will be appreciated by those skilled in the art. For example, the predetermined tolerance range of the load force comprises approximately two hundred sixty-seven newtons ±10%, or approximately between two hundred forty newtons and two hundred ninety-three newtons.

In another example, the load point 118 is coupled with the effort point 112. The fulcrum 122 engages the electronic component 108 to stabilize the fulcrum 122. For example, the fulcrum 122 engages the abutment portion 702 of the frame 126 to stabilize the lever 104. Other implementations of the apparatus 100 may comprise various arrangements of first class, second class, and/or third class levers. Exemplary types of first, second, and third class levers comprise see-saws, wheelbarrows, and mouse traps (not shown), respectively, as will be understood by those skilled in the art.

Upon engagement of the lever 104, the user engages the fastener component 110 to secure the lever 104 in place. For example, the user slides a latch of the fastener component 110 over the lever 104 to secure the lever 104 from movement. The exemplary description herein is easily extendible to an implementation of the apparatus 100 that employs additional fastener components 110, as will be appreciated by those skilled in the art.

The steps or operations described herein are just exemplary. There may be many variations to these steps or operations without departing from the spirit of the invention. For instance, the steps may be performed in a differing order, or steps may be added, deleted, or modified.

Although exemplary implementaion of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising: a plurality of levers that convert a lesser input force to a greater output force for support of a heatsink component coupled with an electronic component;

wherein the plurality of levers comprises a first moment arm lever and a second moment arm lever; wherein the first moment arm lever comprises a leaf spring moment arm lever or wireform moment arm lever that converts the lesser input force to an intermediate force on the second moment arm lever, wherein the intermediate force is greater than the lesser input force;

wherein the second moment arm lever converts the intermediate force on the second moment arm lever to the greater output force, wherein the greater output force is greater than the intermediate force; wherein the second moment arm lever employs the greater output force for support of the heatsink component;

wherein the second moment arm lever applies a compressive force to the heatsink component as the greater output force via a combined deflection of the first moment arm lever and the second moment arm lever.

2. The apparatus of claim 1, wherein the plurality of levers comprises one or more leaf spring moment arm levers and one or more wireform moment arm levers.

3. The apparatus of claim 1, wherein the first moment arm lever comprises a first effort point and a first load point, wherein the second moment arm lever comprises a second effort point and a second load point;
  wherein the first moment arm lever receives the lesser input force through the first effort point and applies the intermediate force to the second moment arm lever through the first load point; wherein the second lever receives the intermediate force through the second effort point and applies the greater output force to the heatsink component through the second load point;
  wherein the second moment arm lever applies the output force to the heatsink component through the second load point for support of the heatsink component.

4. The apparatus of claim 1, wherein the second moment arm lever applies the greater output force against the heatsink component to secure the heatsink component against one or more portions of the electronic component.

5. The apparatus of claim 1, wherein the second moment arm lever comprises a second class moment arm lever that comprises a fulcrum that abuts one or more portions of the electronic component for support.

6. The apparatus of claim 5, wherein the one or more portions of the electronic component comprise one or more first portions of the electronic component, wherein the fulcrum of the second class moment arm lever abuts the one or more first portions of the electronic component for support, wherein the first moment arm lever comprises a second class lever that comprises a fulcrum that abuts one or more second portions of the electronic component.

7. The apparatus of claim 6, wherein the second moment arm lever supports the first effort point of the first moment arm lever, wherein the one or more second portions of the electronic component comprise an abutment portion of the electronic component;
  wherein the fulcrum of the first moment arm lever engages the abutment portion of the electronic component to promote stabilization of the fulcrum of the first moment arm lever.

8. The apparatus of claim 1 in combination with the heatsink component, wherein the heatsink component comprises a substantially flat base that promotes distribution of the greater output force over a face portion of the electronic component.

9. The apparatus of claim 8, wherein the heatsink component conducts at least a portion of heat away from the electronic component.

10. The apparatus of claim 9, wherein operation of the electronic component generates at least a major portion of the heat, wherein the heatsink component cools the electronic component through conduction away from the electronic component of at least a subportion of the major portion of the heat.

11. The apparatus of claim 1, wherein one or more moment arm levers of the plurality of levers are selectively engageable with one or more fastener components for stability of the one or more moment arm levers.

12. The apparatus of claim 1, wherein one or more moment arm levers of the plurality of levers comprise one or more wireform moment arm levers.

13. The apparatus of claim 1, wherein one or more moment arm levers of the plurality of levers comprise one or more leaf spring moment arm levers that serve to maintain the greater output force on the heatsink component within a predetermined tolerance range.

14. The apparatus of claim 13, wherein upon one or more of shock and vibration of the electronic component the one or more leaf spring moment arm levers serve to maintain a thermal interface between the heatsink component and the electronic component in an effective heat conduction relationship.

15. The apparatus of claim 1, wherein the first moment arm lever acts on the second moment arm lever to convert the lesser input force to the greater output force for support of the heatsink component.

16. A method, comprising the step of:
  arranging a plurality of levers in a cooperative relationship that promotes an increase in an output force that supports a heatsink component coupled with an electronic component;
  wherein the plurality of levers comprise a first lever and a second lever, wherein the step of arranging the plurality of levers in the cooperative relationship that promotes an increase of the output force to support the heatsink component coupled with the electronic component comprises the steps of: applying a first input force to the first lever to transmit the output force to the heatsink component coupled with the electronic component; and applying a second input force to the second lever to transmit an intermediate force to the first lever that promotes an increase of the output force on the heatsink component;
  wherein the second lever comprises a leaf spring, wherein the step of applying the second input force to the second lever to transmit the intermediate force to the first lever that promotes the increase of the output force on the heatsink component comprises the step of:
  compressing the leaf spring with the second input force to apply the intermediate force on the first lever.

17. The method of claim 16, further comprising the step of:
  securing one or more of the first and second levers from movement through employment of one or more fastener components to promote an increase in uniformity of one or more of the intermediate force on the first lever and the output force on the heatsink component.

18. The method of claim 16, wherein the first lever comprises a leaf spring, wherein the step of applying the first input force to the first lever to transmit the output force to the heatsink component coupled with the electronic component comprises the step of:
  compressing the leaf spring with the first input force to apply the output force on the heatsink component.

19. The method of claim 16, wherein the step of arranging the plurality of levers in the cooperative relationship that promotes the increase in the output force that supports the heatsink component coupled with the electronic component comprises the step of:
  maintaining a thermal interface between the heatsink component and the electronic component during one or more of shock and vibration of the electronic component.

20. The method of claim 19, wherein the plurality of levers comprise one or more leaf springs, wherein the step of maintaining the thermal interface between the heatsink component and the electronic component during the one or more of the shock and vibration of the electronic component comprises the step of:

maintaining the output force within a predetermined tolerance range through employment of the one or more leaf springs.

21. The method of claim 16, wherein the plurality of levers comprises a plurality of leaf springs, wherein the step of arranging the plurality of levers in the cooperative relationship that promotes the increase in the output force that supports the heatsink component coupled with the electronic component comprises the step of:
arranging the plurality of leaf springs in the cooperative relationship that promotes the increase in the output force that supports the heatsink component coupled with the electronic component.

22. The method of claim 16, wherein the plurality of levers comprises one or more leaf springs and one or more wireform levers, wherein the step of arranging the plurality of levers in the cooperative relationship that promotes the increase in the output force that supports the heatsink component coupled with the electronic component comprises the step of:
arranging the more leaf springs and the one or more wireform levers in the cooperative relationship that promotes the increase in the output force that supports the heatsink component coupled with the electronic component.

23. The apparatus of claim 1, wherein the first moment arm lever compresses the second moment arm lever.

24. The apparatus of claim 1, wherein the first moment arm lever and the second moment arm lever cooperate to form a compound lever.

25. The apparatus of claim 1, wherein the first moment arm lever receives the lesser input force as torque exerted from a hand of a person, wherein the combined deflection of the first moment arm lever and the second moment arm lever causes the greater output force applied to the heatsink component as the compressive force to be substantially greater than the lesser input force as the torque received from the hand of the person.

26. The apparatus of claim 1, wherein the first moment arm lever receives the lesser input force as a later lesser input force of torque, wherein the second moment arm lever receives an earlier lesser input force of torque, wherein the combined deflection of the first moment arm lever and the second moment arm lever causes a combined mechanical advantage compressive force applied for support of the heatsink component to be substantially greater than a sum of the earlier lesser input force of the torque on the second moment arm lever and the later lesser input force as the torque on the first moment arm lever.

27. The apparatus of claim 26, wherein the earlier lesser input force on the second moment arm lever and the later lesser input force on the first moment arm lever comprise a substantially same amount of torque exertion, wherein a ratio of the combined mechanical advantage compressive force applied for support of the heatsink component to the substantially same amount of torque exertion is substantially equal to twelve.

28. The apparatus of claim 1, wherein the first moment arm lever receives the lesser input force as a later lesser input force of torque exerted from a hand of a person, wherein the second moment arm lever receives an earlier lesser input force of torque exerted from the hand of the person, wherein the combined deflection of the first moment arm lever and the second moment arm lever causes a combined mechanical advantage compressive force applied for support of the heatsink component to be substantially greater than a sum of the earlier lesser input force of the torque on the second moment arm lever exerted from the hand of the person and the later lesser input force as the torque on the first moment arm lever exerted from the hand of the person.

29. The apparatus of claim 28, wherein the earlier lesser input force from the hand of the person on the second moment arm lever and the later lesser input force from the hand of the person on the first moment arm lever comprise a substantially same amount of torque exertion from the hand of the person, wherein a ratio of the combined mechanical advantage compressive force applied for support of the heatsink component to the substantially same amount of torque exertion from the band of the person is substantially equal to twelve.

30. The apparatus of claim 28, wherein the first moment arm lever and the second moment arm lever cooperate to multiply the later lesser input force from the hand of the person on the first moment arm lever to a substantially larger compressive force component applied for support of the heatsink component.

31. The apparatus of claim 30, wherein a ratio of the substantially larger compressive force component applied for support of the heatsink component to the later lesser input force from the hand of the person on the first moment arm lever is substantially equal to four.

32. The apparatus of claim 28, wherein the first moment arm lever and the second moment arm lever cooperate to multiply the earlier lesser input force from the hand of the person on the second moment arm lever to a substantially larger compressive force component applied for support of the heatsink component.

33. The apparatus of claim 32, wherein a ratio of the substantially larger compressive force component applied for support of the heatsink component to the later lesser input force from the hand of the person on the first moment arm lever is substantially equal to three.

34. A method, comprising the steps of:
converting a lesser input force to an intermediate force through employment of a first moment arm lever that comprises a leaf spring moment arm or wireform moment arm lever, wherein the intermediate force is greater than the lesser input force;
converting the intermediate force to an output force on a heatsink component through employment of a second moment arm lever, wherein the output force is greater than the intermediate force; and
applying a compressive force to the heatsink component as the output force through employment of the second moment arm lever via a combined deflection of the first moment arm lever and the second moment arm lever.

35. The method of claim 34, further comprising the step of:
securing one or more of the first and second moment arm levers to maintain the output force on the heatsink component.

36. The method of claim 34, further comprising the steps of:
exerting an earlier lesser input force of torque on the second moment arm lever from a hand of a person;
exerting, as the lesser input force converted to the intermediate force, a later lesser input force of torque on the first moment arm lever from the hand of the person;
wherein the combined deflection of the first moment arm lever and the second moment arm lever causes a combined mechanical advantage compressive force applied for support of the heatsink component to be substantially greater than a sum of the earlier lesser input force of the torque on the second moment arm lever exerted from the hand of the person and the later lesser input force as the torque on the first moment arm lever exerted from the hand of the person.

37. A method, comprising the steps of:

arranging a plurality of levers in a cooperative relationship to support a heatsink component coupled with an electronic component, wherein the plurality of levers comprise a first moment arm lever and a second moment arm lever, wherein the second moment arm lever comprises a leaf spring moment arm lever or wireform moment arm lever; and applying a first input force of torque to the first moment arm lever and a second input force of torque to the second moment arm lever to cause the first moment arm lever to apply a compressive force to the heatsink component as a combined mechanical advantage compressive force via a combined deflection of the first moment arm lever and the second moment arm lever;

wherein the combined mechanical advantage compressive force applied for support of the heatsink component is substantially greater than a sum of the first input force of torque on the first moment arm lever and the second input force of torque on the second moment arm lever.

* * * * *

UNITED STATES PATENT AND TRADEMARK OFFICE
CERTIFICATE OF CORRECTION

PATENT NO. : 7,123,482 B2
APPLICATION NO. : 10/737377
DATED : October 17, 2006
INVENTOR(S) : Stephan Karl Barsun et al.

It is certified that error appears in the above-identified patent and that said Letters Patent is hereby corrected as shown below:

In column 10, line 13, in Claim 29, delete "band" and insert -- hand --, therefor.

Signed and Sealed this

Fifth Day of January, 2010

David J. Kappos
*Director of the United States Patent and Trademark Office*